(12) United States Patent
Sato et al.

(10) Patent No.: US 7,705,474 B2
(45) Date of Patent: Apr. 27, 2010

(54) CONNECTION STRUCTURE FOR CONNECTING FLEXIBLE PRINTED CIRCUIT TO MAIN SUBSTRATE USING A POTTING RESIN IN A THROUGH-HOLE

(75) Inventors: Kunikazu Sato, Kariya (JP); Kazuhiro Maeno, Kariya (JP); Takamasa Nodo, Kariya (JP); Satoshi Ito, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 311 days.

(21) Appl. No.: 11/670,645

(22) Filed: Feb. 2, 2007

(65) Prior Publication Data

US 2007/0194428 A1    Aug. 23, 2007

(30) Foreign Application Priority Data

Feb. 3, 2006    (JP)    ............................. 2006-027779

(51) Int. Cl.
*H01L 23/48*    (2006.01)
*H01L 23/52*    (2006.01)

(52) U.S. Cl. .................. 257/786; 257/181; 257/688; 257/773

(58) Field of Classification Search ................. 257/181, 257/688, E23.055, E23.065, E23.177, 689, 257/773, 786
See application file for complete search history.

(56) References Cited

U.S. PATENT DOCUMENTS

2004/0017536 A1*    1/2004    Takenaka ..................... 349/150

FOREIGN PATENT DOCUMENTS

JP    62-073576    4/1987
JP    7-38253    2/1995

* cited by examiner

*Primary Examiner*—Hung Vu
(74) *Attorney, Agent, or Firm*—Woodcock Washburn LLP

(57) ABSTRACT

A main substrate is provided with a wiring pattern on its surface and in the inner layer. A wiring pattern for connecting the signal line or power line of the main substrate to an external circuit is formed on the flexible printed circuit. A connection terminal to which a corresponding wiring pattern is connected is formed at the tip of the flexible printed circuit. A through-hole is formed between the wiring patterns. Potting resin is potted in each through-hole and around it. When the resin hardens, the potting resin joints the main substrate and the flexible printed circuit.

3 Claims, 13 Drawing Sheets

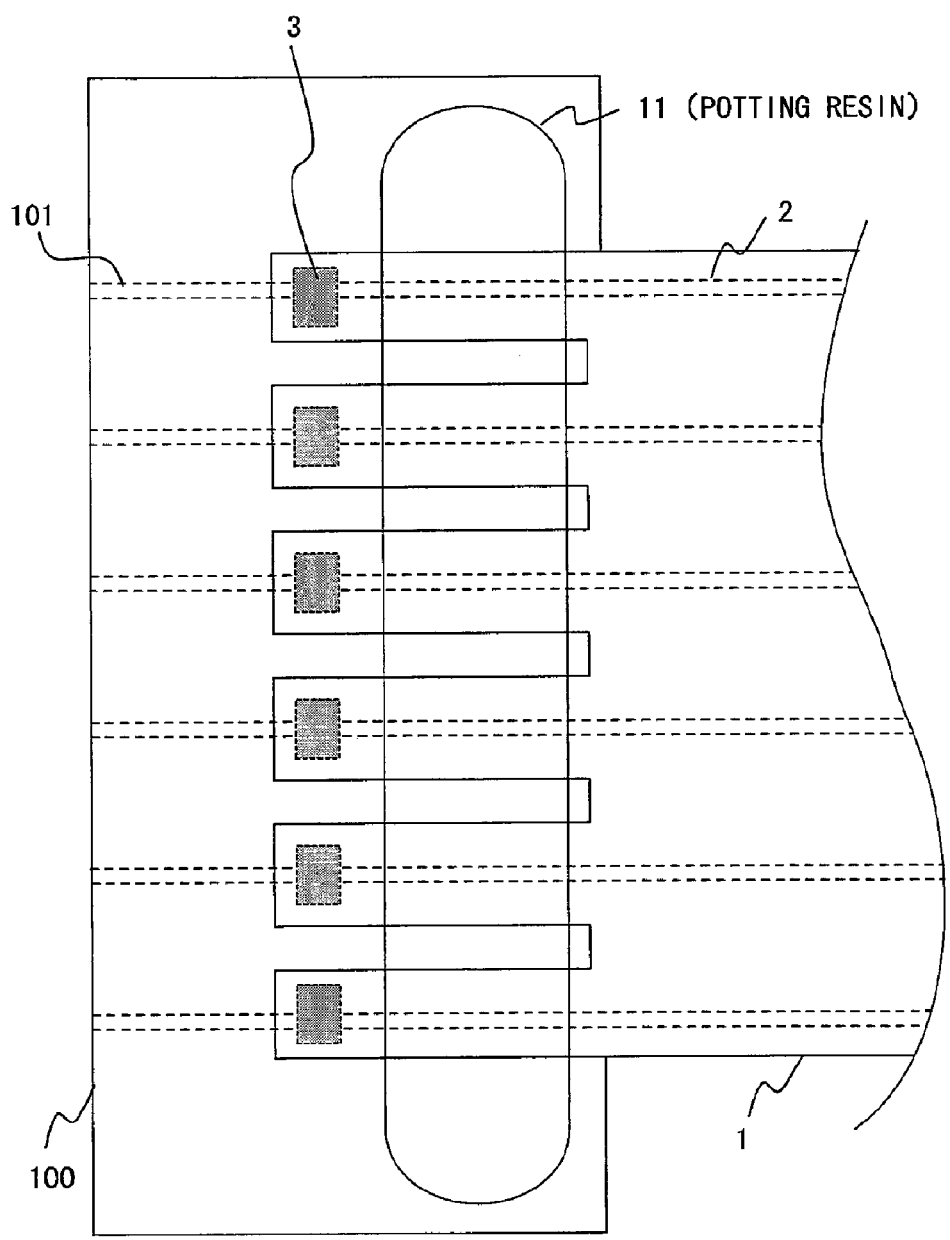
F I G. 5

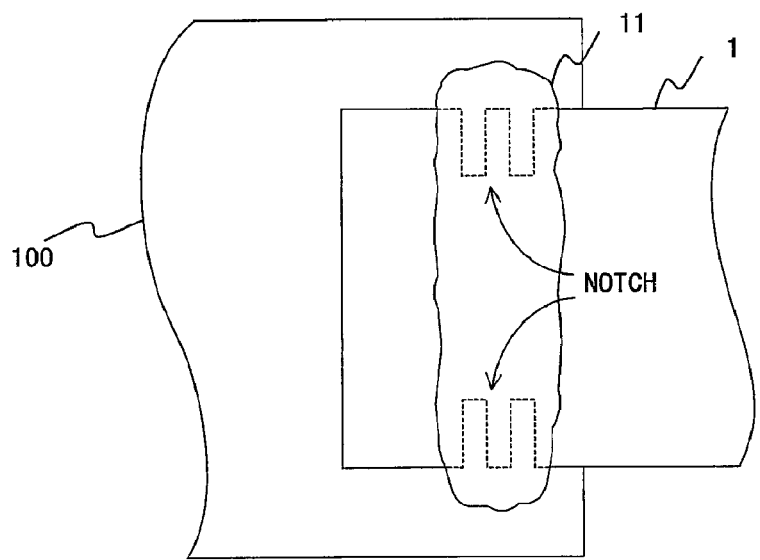
F I G. 6 A

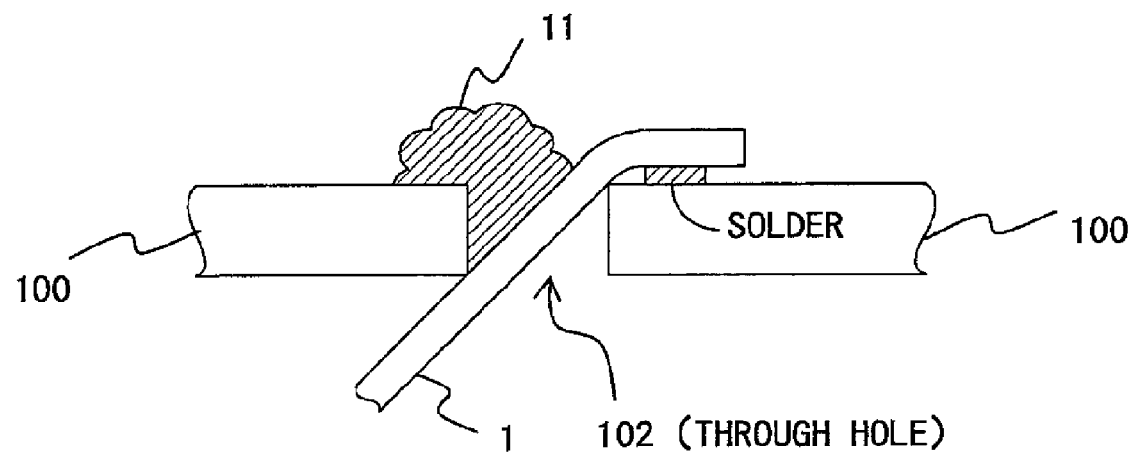
F I G. 6 B

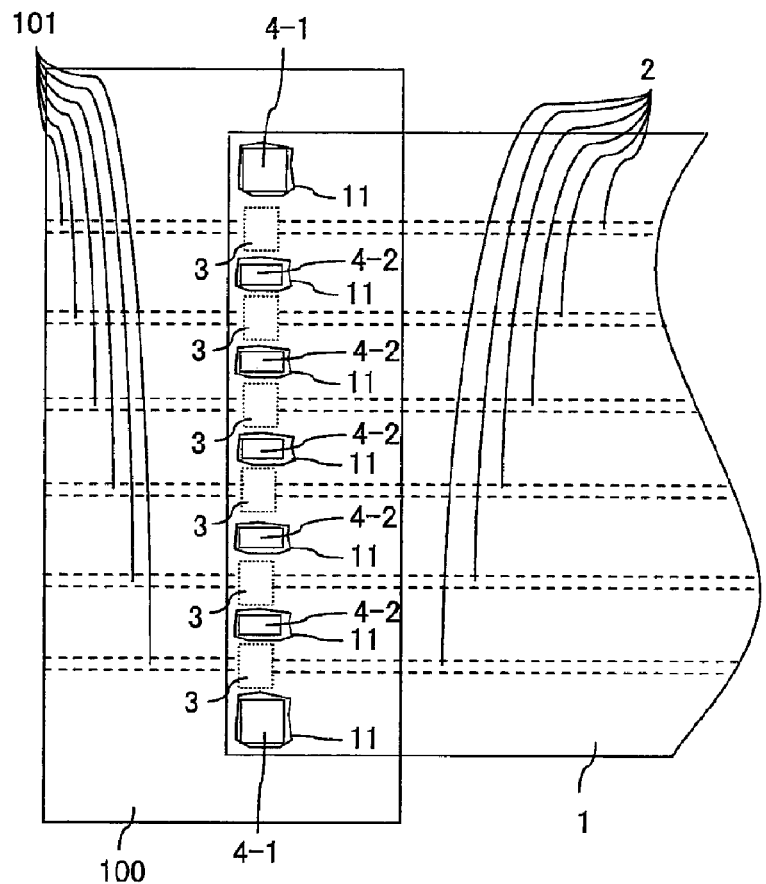
F I G. 7 A

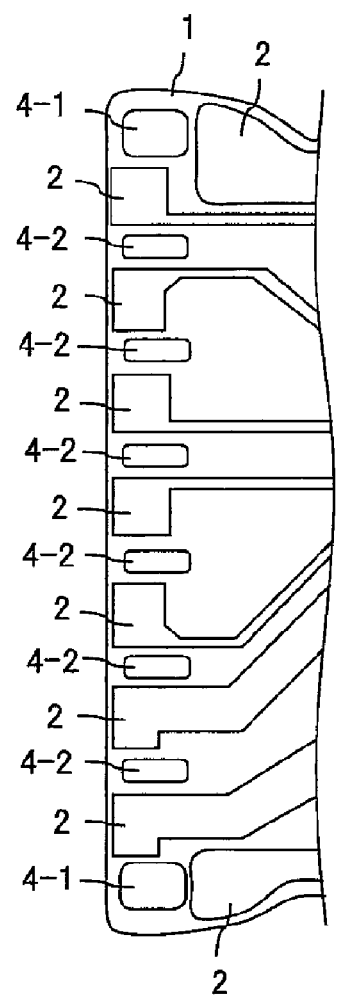
F I G. 7B

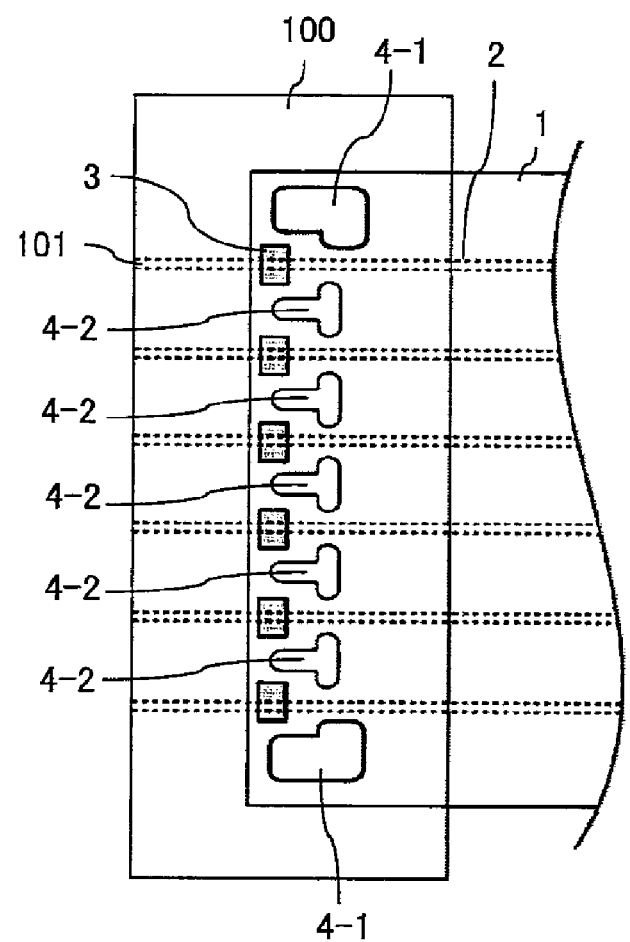
F I G. 8

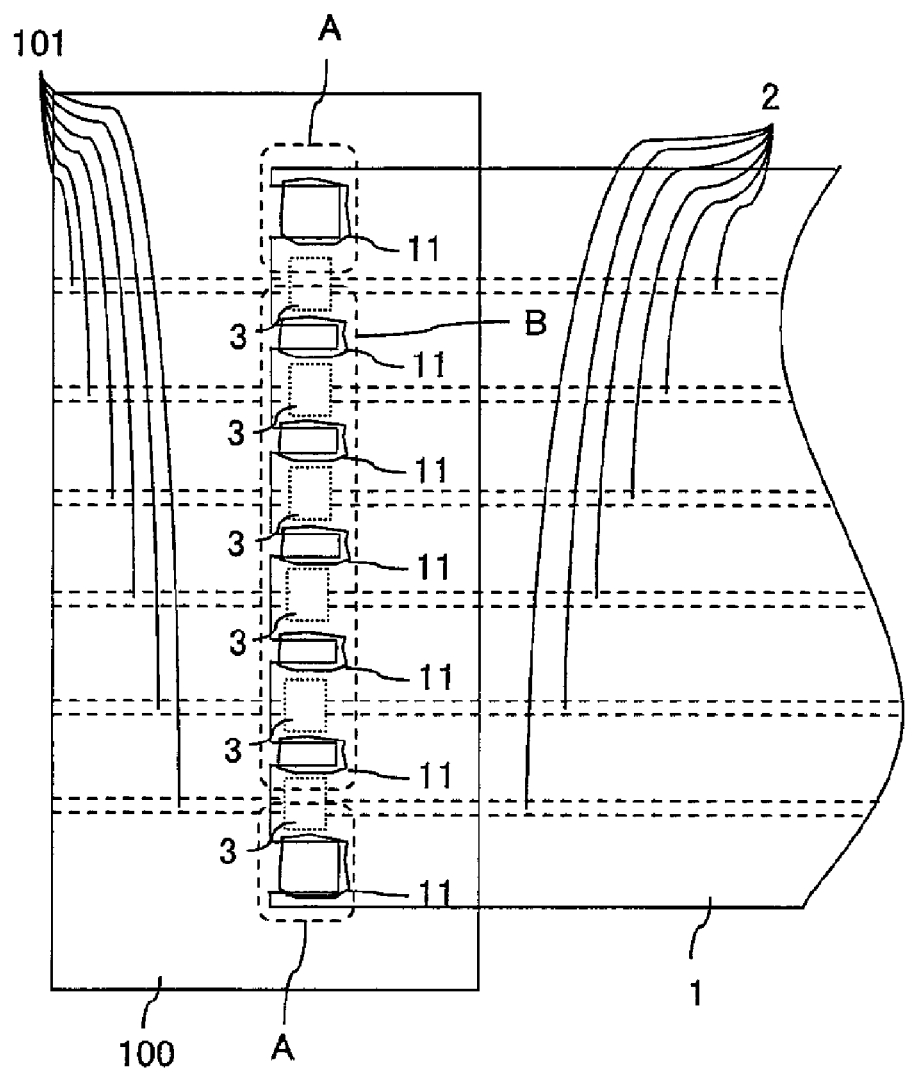
F I G. 9

CONNECTION STRUCTURE FOR CONNECTING FLEXIBLE PRINTED CIRCUIT TO MAIN SUBSTRATE USING A POTTING RESIN IN A THROUGH-HOLE

CROSS-REFERENCE TO RELATED APPLICATION

This application claims priority to Japanese Patent Application No. 2006-027779 filed Feb. 3, 2006.

BACKGROUND OF THE INVENTION

1. Field of the Invention

The present invention relates to a connection structure for connecting a flexible substrate to a main substrate provided with a wiring pattern and a connection method thereof.

2. Description of the Related Art

Conventionally a flexible printed circuit is used to connect a signal line or a power line on a main substrate provided with a wiring pattern to an external circuit. The flexible printed circuit is generally a sheet-like flexible substrate and on its surface or its inner layer a wiring pattern is formed.

When a main substrate and a flexible printed circuit are electrically connected, part of the wiring pattern formed on the main substrate and part of a corresponding wiring pattern formed on the flexible printed circuit are electrically connected by solder or the like. However, if these substrates are simply connected by solder or the like, its strength is not sufficient and there is a possibility that their joint part may come off. Therefore, methods for reinforcing the connection between the main substrate and the flexible printed circuit are proposed.

In Patent reference 1 (Japanese Utility Model Application No. S62-73576 (FIGS. 3 and 4)), as shown in FIGS. 1A and 1B (side view), resin potting which acts as adhesive is applied to reinforce the connection between a main substrate 100 and a flexible printed circuit 110. Thus, when a product including the main substrate 100 and the flexible printed circuit 110 is assembled or used, the pulling stress of the joint part is absorbed by the potting resin to mitigate stress to the solder joint part.

In Patent reference 2 (Japanese Patent Application No. H7-38253 (FIGS. 3 and 4)), the main substrate 100 and the flexible printed circuit 110 are connected as shown in FIG. 2. A copper connection foil 121 is formed on the top surface of the main substrate 100 and furthermore a resist 122 is provided on the top surface of the copper connection foil 121. A wiring pattern 123 and a cover film 124 are formed on the flexible printed circuit 110. The copper connection foil 121 and the wiring pattern 123 are connected by a thick-plated solder-pressed joint part 125. Then, adhesive 126 is spread on the contact surface between the main substrate 100 and the flexible printed circuit 110 to reinforce the joint part.

As another structure, a method for fixing the connection between the main substrate and the flexible printed circuit using rivets or the like is also proposed.

However, in the structure disclosed in Patent reference 1, it is only in the end of the resin potting area in the shorter side direction of the flexible printed circuit 110 (part enclosed by broken lines in FIG. 1A) that connection effect due to potting resin can be obtain. Therefore, sufficient reinforcement effect cannot be obtained in this structure. In the center area of the flexible printed circuit 110, the reinforcement effect fades and space efficiency becomes low.

In the structure disclosed in Patent reference 2, fairly good reinforcement effect can be obtained. However, since it is not easy to spread adhesive 126 between the main substrate 100 and the flexible printed circuit 110 after soldering, a complex process or the increase of a material cost is feared.

In the structure for fixing the connection between the main substrate and the flexible printed circuit using rivets or the like, since space is necessary for the rivets, it is difficult to miniaturize the flexible printed circuit.

SUMMARY OF THE INVENTION

It is an object of the present invention to provide a structure for connecting a flexible printed circuit to a main substrate with sufficient strength without introducing complex work and a method thereof.

The structure of the present invention is used to connect a flexible printed circuit to a main substrate. A wiring pattern is formed on the main substrate. The flexible printed circuit comprises a plurality of connection terminals for connection to the wiring pattern of the main substrate, a plurality of wiring patterns connected to each of the plurality of connection terminals and a through-hole formed between the plurality of wiring patterns. Then, potting resin (for example, normal hardening silicon resin, etc.) is provided in and around the through-hole in such a way as to reach the main substrate.

In this structure, since the flexible printed circuit and the main substrate are joined in each through-hole, an area where the adhesion effect can be obtained increases, thereby improving the adhesion effect as a whole. The joint between the main substrate and the flexible printed circuit can be reinforced only with providing potting resin in the state where the flexible printed circuit is connected to the main substrate by soldering work.

In the connection structure of another aspect of the present invention, the tip of the flexible printed circuit is formed in a comb-shape and a plurality of connection terminals for connecting the wiring pattern of the main substrate is provided at the tip of each projection of the comb-shaped part. Then, potting resin is provided in the comb-shaped part in such a way as to reach the main substrate. According to this structure, the flexible printed circuit and the main substrate are joined at each concave part of the comb.

In the connection structure of another aspect of the present invention, a notch is formed in the prescribed part of the end of the flexible printed circuit. Then, potting resin is provided in and around the notch in such a way as to reach the main substrate. According to this structure, the flexible printed circuit and the main substrate are joined using the notch part.

In the connection structure of another aspect of the present invention, a through-hole is formed on the main substrate. The flexible printed circuit is connected to the main substrate in a state where a tip of the flexible printed circuit passes through the through-hole. Then, potting resin is provided in the through-hole and around it in such a way as to reach the flexible printed circuit.

In the connection structure of another aspect of the present invention, a wiring pattern and a through-hole are formed on the main substrate. A tip of the flexible printed circuit provided with a plurality of connection terminals for connecting the flexible printed circuit to the wiring pattern provided on the main substrate. Then, potting resin is provided in the through-hole and around it in such a way as to reach the flexible printed circuit in a state where the flexible printed circuit is connected to the main substrate, using the plurality of connection terminals.

The connection method of the present invention the flexible printed circuit provided with a plurality of connection terminals for connecting a wiring pattern on the main substrate and a plurality of wiring patterns connected to each of the plurality of connection terminals, to the main substrate on which a wiring pattern is formed. Then, a through-hole is formed between the plurality of wiring patterns on the flexible printed circuit, the each of the wiring patterns of the main substrate and the each of the wiring patterns of the flexible printed circuit are connected by solder and potting resin is provided in and around the through-hole in such a way as to reach the main substrate. According to this method, there is no need to spread adhesive or the like between the main substrate and the flexible printed circuit after soldering work and the joint between them can be reinforced simply by potting resin.

In the connection structure of another aspect of the present invention, the flexible printed circuit is further provided with an outside through-hole in the outside area of the plurality of wiring pattern. Then, potting resin is provided in the through-hole, in the outside through-hole and around it in such a way as to reach the main substrate.

In the connection structure of another aspect of the present invention, the area of an outside though-hole larger than that of the though-hole formed between the plurality of wiring patterns. In this structure, greater connection effect can be obtained.

In the connection structure of another aspect of the present invention, the flexible printed circuit is further provide with a concave part in the outside areas of the plurality of connection terminals at an tip of the projection. Then, potting resin is provided with the comb-shaped part, the concave part and around them in such a way as to reach the main substrate.

In the connection structure of another aspect of the present invention, the area of the concave part in outside area of the plurality of connection terminals is larger than that of the concave part of the comb-shaped part. In this structure too, greater connection effect can be obtained.

According to the present invention, a flexible printed circuit can be connected to a main substrate with sufficient strength without introducing complex work.

BRIEF DESCRIPTION OF THE DRAWINGS

FIG. 5 shows a variation of the connection structure according to the present invention (No. 1);

FIG. 6A shows a variation of the connection structure according to the present invention (No. 2);

FIG. 6B shows a variation of the connection structure according to the present invention (No. 3);

FIG. 7A shows a variation of the connection structure according to the present invention (No. 5);

FIG. 7B shows the preferred embodiment of the flexible printed circuit according to the present invention (No. 2);

FIG. 8 shows a variation of the connection structure according to the present invention (No. 6); and FIG. 9 shows a variation of the connection structure according to the present invention (No. 7).

DETAILED DESCRIPTION OF ILLUSTRATIVE EMBODIMENTS

Figure 3:
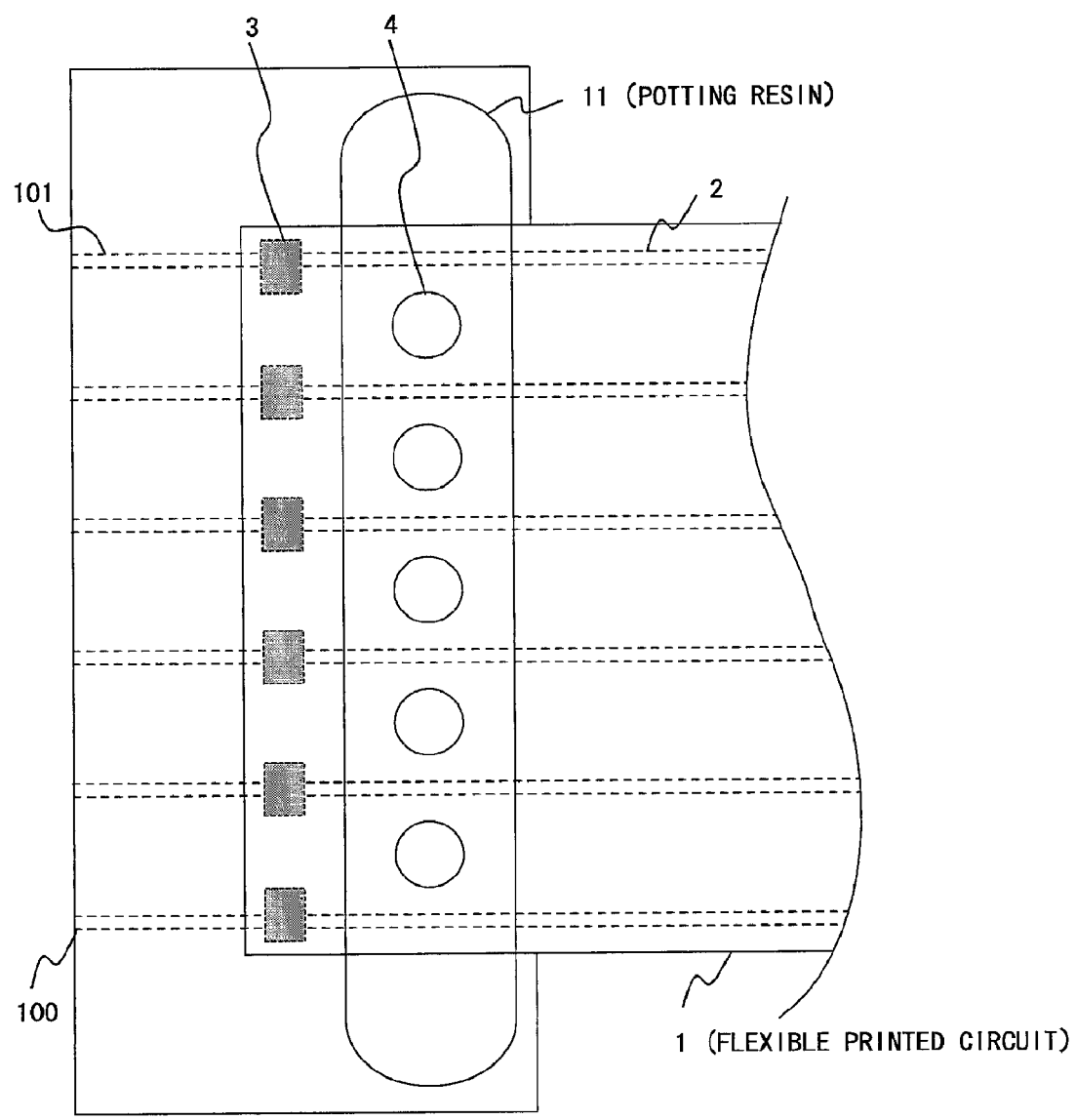
FIG. 3 shows an example of the connection structure in the preferred embodiment of the present invention.

FIG. 3 shows an example of the connection structure in the preferred embodiment of the present invention. In FIG. 3, for a main substrate 100, an FR4 substrate, a glass epoxy substrate, an aluminum substrate or the like is used and the main substrate 100 is provided a wiring pattern 101 constituting an electrical circuit, on its surface and/or in the inner layer. A flexible printed circuit (FPC) 1 is a flexible sheet-like substrate for connecting the signal line or power line on the main substrate 100 to an external circuit and is made of, for example, polyimide.

A wiring pattern 2 for connecting the signal line or power line on the main substrate 100 to an external circuit is formed on the flexible printed circuit 1. A plurality of connection terminals (soldering land) 3 for connecting the wiring pattern 101 of the main substrate 100 to the wiring pattern 2 of the flexible printed circuit 1 is formed at the tip of the flexible printed circuit 1. In this case, each connection terminal 3 is connected to the corresponding wiring pattern 2, respectively. A soldering land, which is not shown in FIG. 3, is also provided in the corresponding position of the main substrate 100. The land for soldering of the corresponding wiring patterns 101 and 2 is soldered each other, and a connection terminal is formed.

The flexible printed circuit 1 is provided with a through-hole 4 in the surrounding of an area where the connection terminal 3 is formed and also between the wiring patterns 2. The diameter of the through-hole 4 is, for example, 1 mm or more, preferably 1.5 mm or more, although it depends on the thickness of the flexible printed circuit 1 and the viscosity of potting resin 11, which is described later, and the like.

Figure 1A:
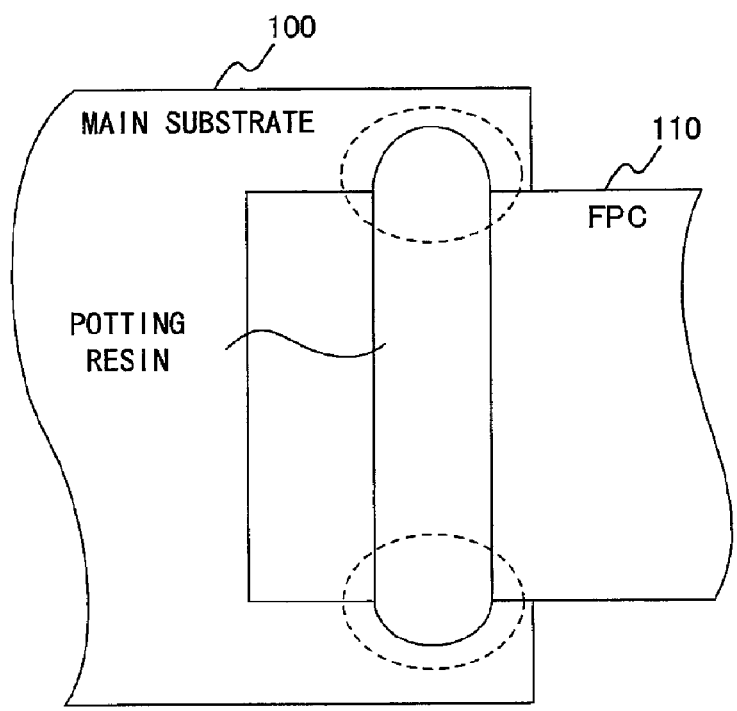
FIG. 1A is the top view of the main substrate to which the flexible printed circuit is connected by the conventional connection method.
Figure 1B:
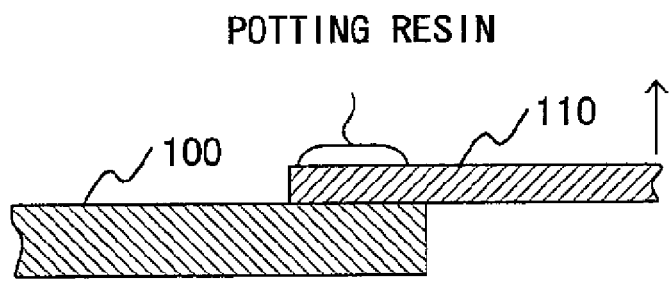
FIG. 1B is the side view of the main substrate to which the flexible printed circuit is connected by a conventional connection method.
Figure 2:
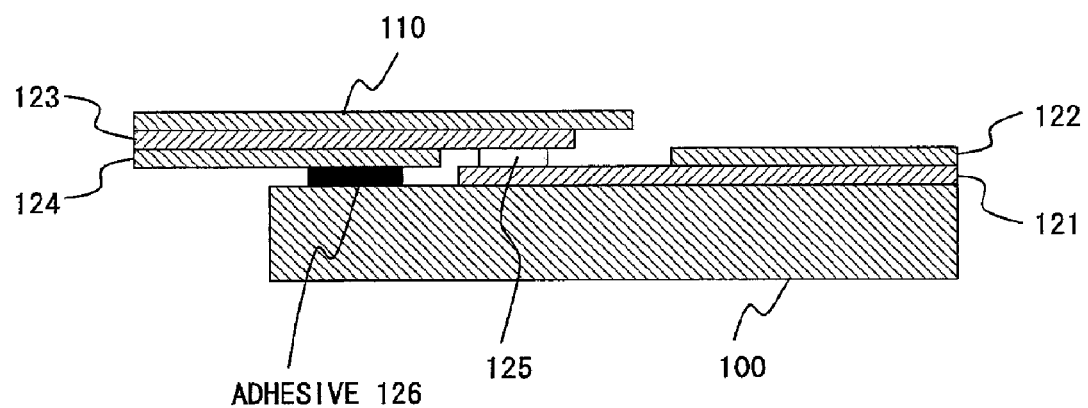
FIG. 2 is the side view of the main substrate to which the flexible printed circuit is connected by another conventional connection method.

The potting resin 11 is provided on the surface side of the flexible printed circuit 1 connected on the top surface of the main substrate 100. In this case, the potting resin 11 is provided at least in each through-hole 4 and around it and is also provided in the end area of the flexible printed circuit 1 as needed. Thus, the potting resin 11 flows down to reach the main substrate 100 via the through-hole 4. In the end area of the flexible printed circuit 1, the potting resin 11 flows down to reach the main substrate 100, as in the prior art shown in FIG. 1A.

When the resin hardens, the potting resin 11 joints the main substrate 100 and the flexible printed circuit 1. At this time, in the structure shown in FIG. 3, the flexible printed circuit 1 is also jointed to the main substrate 100 not only in the end area of the flexible printed circuit 1 but also in an area where the through-hole 4 is formed, by the porting resin 11. Then, according to this structure, the flexible printed circuit 1 is jointed to the main substrate 100 not only in the end area of the flexible printed circuit 1 but also in its center area. Therefore, according to this structure, reinforcement effect more sufficient than that of Patent reference 1 in which the main substrate 100 is jointed only in the end area of the flexible printed circuit 1.

The connection structure of the preferred embodiment can be realized by firstly forming a through-hole 4 in the flexible printed circuit 1 in advance, then connecting the wiring pattern 101 of the main substrate 100 and the wiring pattern 2 of the flexible printed circuit 1 by solder and lastly providing potting resin 11. Therefore, the connection method of the preferred embodiment needs no troublesome process of spreading adhesive while bending the flexible printed circuit after soldering, thereby realizing workability better than that of the method disclosed by Patent reference 2.

The shape of the through-hole 4 is not limited to round and another shape can also be possible. However, taking into consideration the easy flow of the potting resin 11, round is preferable.

Figure 4:
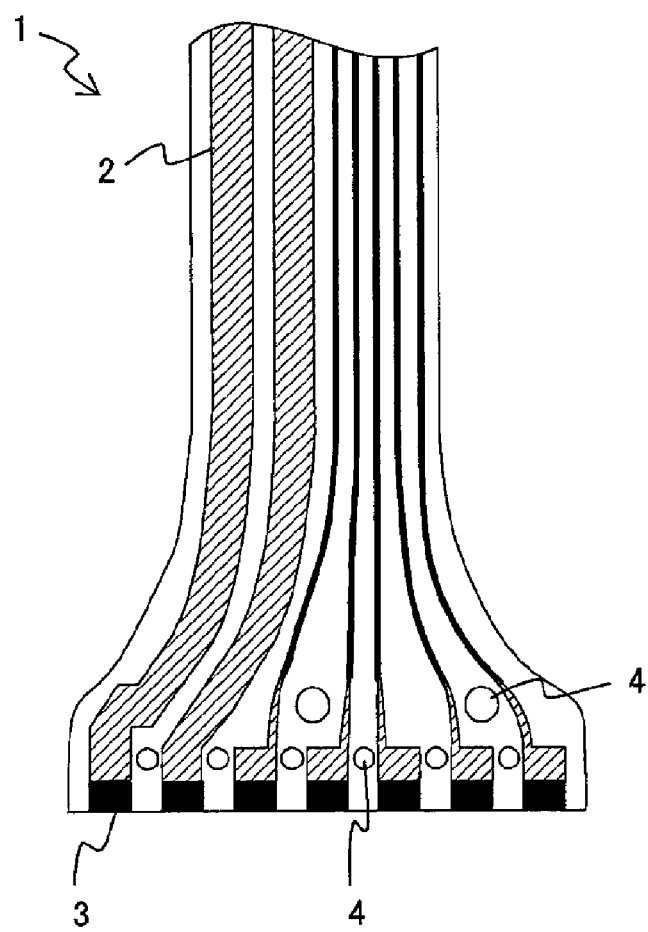
FIG. 4 shows the preferred embodiment of the flexible printed circuit according to the present invention (No. 1)

FIG. 4 shows the preferred embodiment of the flexible printed circuit 1 according to the present invention. As shown in FIG. 4, the respective sizes of the through-holes 4 can be different. The respective number can also be different. In FIG. 4, one or two through-holes 4 are provided between the wiring patterns 2.

Figure 6C:
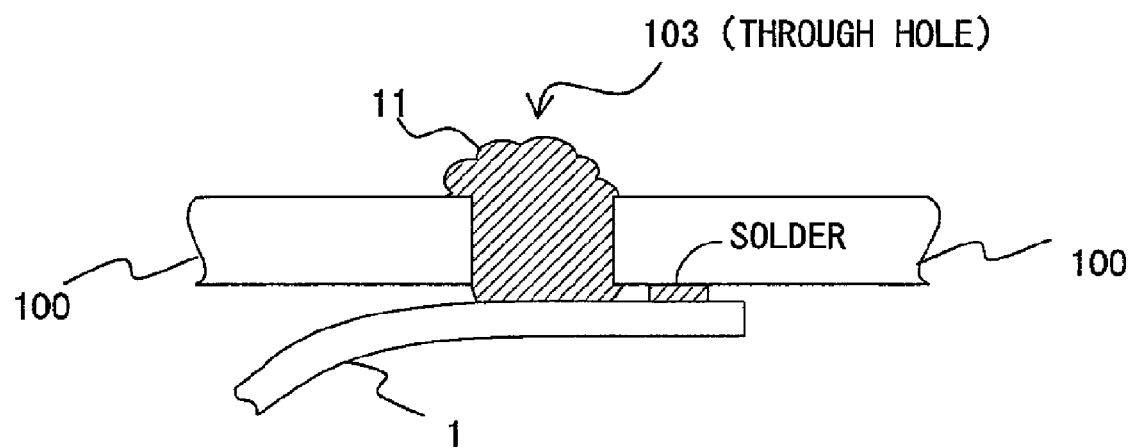
FIG. 6C shows a variation of the connection structure according to the present invention (No. 4)

FIGS. 5-6C show the variations of the connection structure according to the present invention. The variations of the connection structure according to the present invention are described below with the drawings.

In the structure shown in FIG. 5, the tip of the flexible printed circuit 1 is formed in a comb shape and connection terminals 3 are provided at the tip of each projection of the comb-shaped part. Then, potting resin 11 is provided to flow into the comb-shaped part and to reach the main substrate 100. According to this structure, since the main substrate 100 and the flexible printed circuit 1 joint in a plurality of places other than the end, as in the structure shown in FIG. 3, its strength can improve.

In the structure shown in FIG. 6A, one or more notches are formed in the prescribed parts of the end of the flexible printed circuit 1. In this case, the "prescribed part of the end" is the side face of an area near the end of the flexible printed circuit 1 show in FIG. 6A. Then, potting resin 11 is provided in such a way as to flow down to reach the main substrate 100 via the notches.

In the structure shown in FIG. 6B, the main substrate 100 is provided with a through-hole 102 which pass through the flexible printed circuit 1. A connection terminal is provided at the tip of the flexible printed circuit 1 and the flexible printed circuit 1 is soldered to the main substrate 100 in the state where it passes through the through-hole 102. Then, potting resin 11 fixes the flexible printed circuit 1 to the main substrate 100, using the through-hole 102.

In the structure shown in FIG. 6C, the main substrate 100 is provided with a through-hole 103 for flowing potting resin 11. A connection terminal is provided at the tip of the flexible printed circuit 1, which is soldered to the surrounding of the through-hole 103 of the back surface of the main substrate 100. Then, potting resin 11 is flown into the through-hole 103 in such a way as to reach the flexible printed circuit 1 from the front surface side of the main substrate 100. The structure shown in FIG. 6C is particularly useful to a preferred embodiment in which the back surface of the main substrate 100 is not touched to a heat sink or the ground.

In the structure shown in FIG. 7A, the flexible printed circuit 1 shown in FIG. 3 is further provided with a through-hole 4-1 (outside through-holes) in each outside area of the plurality of wiring pattern 2 groups and the through-hole 4-1 is larger than another through-hole 4-2 (through-hole provided between the wiring patterns 2). As in the above-described preferred embodiment, potting resin 11 is applied to at least each of the through-holes 4-1 and 4-2 and around the through-holes.

Resin potting can also be applied to the end area of the flexible printed circuit 1 as needed. When the potting resin 11 flows down via the through-holes 4-1, 4-2 and the like in such a way as to reach the main substrate 100 to harden, the main substrate 100 and the flexible printed circuit 1 joint.

FIG. 7B shows the preferred embodiment of the flexible printed circuit 1 shown in FIG. 7A. As shown in FIG. 7B, the through-hole 4-1 is larger than the through-hole 4-2. Alternatively, only the through-hole 4-1 isn't necessarily provided in the outside area of the wiring pattern 2 group. Specifically, as shown in FIG. 7B, the through-hole 4-1 can be formed in parallel with the wiring pattern 2 at the end of the flexible printed circuit 1.

A place where the most external force and stress is applied in the connection part between the main substrate 100 and the flexible printed circuit 1 is both ends of the flexible printed circuit 1 (that is, both ends connection part of a plurality of connection parts to which each land of a plurality of wiring patterns 101 of the main substrate 100 and a plurality of connection terminals 3 of the flexible printed circuit 1 are soldered each other). As shown in FIG. 7A, the connection strength of the connection part between the main substrate 100 and the flexible printed circuit 1 can be improved by making the through-hole 4-1 larger than the through-hole 4-2.

Therefore, according to this structure, reinforcement effect greater than that of Patent reference 1 in which the main substrate 100 is jointed to the end area of the flexible printed circuit 1 and the structure shown in FIG. 3 can be obtained.

Since this structure is realized by firstly forming through-holes 4-1 and 4-2 in the flexible printed circuit 1, then connecting the land of the wiring pattern 101 of the main substrate 100 and the connection terminal 3 of the flexible printed circuit 1 by solder and lastly providing potting resin 11, no troublesome process of spreading adhesive while bending the flexible printed circuit after soldering, as in the above-described preferred embodiments, thereby realizing workability better than that of the method disclosed by Patent reference 2.

In the structure shown in FIG. 7A, the mounting area of the flexible printed circuit 1 can be expanded by further reducing the size of the through-hole 4-2. Therefore, the structure where the through-hole 4-1 is made larger and the through-hole 4-2 is made smaller thus can realize both the securement of the strength of the connection part between the main substrate 100 and the flexible printed circuit 1 and the degradation suppression of the mounting density of the flexible printed circuit 1.

In the structure shown in FIG. 7A, as shown in FIG. 8, the respective shapes of the through-holes 4-1 and 4-2 can also be formed in a T-character or an L-character. Since the circumference length of a hole can be made longer than that of the structure shown in FIG. 7A by making it such structure, a connection part between the hem of the through-hole and the potting resin 11 can be increased, thereby further improving the connection strength of the connection part between the main substrate 100 and the flexible printed circuit 1.

Although potting resin 11 is potted for each through-hole 4-1 or 4-2 in the structure shown in FIG. 7A, as shown in FIG. 3, potting resin 11 can also be applied once in such a way as to bridge the through-hole 4. By structuring as mentioned above, only one stroke of the vertical movement of a device for applying resin potting is sufficient. There for, a time required to fix the flexible printed circuit 1 to the main substrate 100 can be reduced compared with that of FIG. 7A.

In the structure shown in FIG. 9, a concave part is further provided in the outside area of the plurality of connection terminals 3 (part enclosed by a broken line frame A shown in FIG. 9) of the tip of the flexible printed circuit 1 shown in FIG. 5 and the concave part is made larger than a concave part of the another comb-shaped part (part enclosed by a broken line frame B shown in FIG. 9). Then, resin potting is applied to the concave part, the concave part of another comb-shaped part and their surrounding by the same method as described above. Thus, by making the concave part provided in the outside area of the plurality of connection terminals 3 larger than that of another comb-shaped part, the connection strength of the connection part between the main substrate 100 and the flexible printed circuit 1 can be improved by making the concave part provided in the outside area of the plurality of connection terminals 3 larger that of another comb-shaped part, as in the structure shown in FIG. 7A.

Therefore, according to this structure, reinforcement effect greater than that of Patent reference 1 in which the main substrate 100 is jointed to the end area of the flexible printed circuit 1 and that of the structure shown in FIG. 5. This structure needs no troublesome process of spreading adhesive while bending the flexible printed circuit after soldering, as in the above-described preferred embodiments, thereby realizing workability better than that of the method disclosed by Patent reference 2.

What is claimed:

1. A connection structure, comprising:
  a main substrate on which a wiring pattern is formed;
  a flexible printed circuit provided with a plurality of connection terminals for connecting the wiring pattern of the main substrate, a plurality of wiring patterns connected to each of the plurality of connection terminals and a through-hole formed between the plurality of wiring patterns; and
  potting resin provided in and around the through-hole in such a way as to reach the main substrate.

2. The connection structure according to claim 1, wherein
  the flexible printed circuit is further provided with an outside through-hole in an outside area of the plurality of wiring patterns; and
  the potting resin is provided in the through-hole, in the outside through-hole and around the through-holes in such a way as to reach the main substrate.

3. The connection structure according to claim 2, wherein
  the area of the outside through-hole is larger than that of the through-hole formed between the plurality of wiring patterns.

* * * * *